United States Patent
Yang et al.

(10) Patent No.: US 12,052,844 B2
(45) Date of Patent: Jul. 30, 2024

(54) HEAT DISSIPATION STRUCTURE

(71) Applicants: Inventec (Pudong) Technology Corporation, Shanghai (CN); INVENTEC CORPORATION, Taipei (TW)

(72) Inventors: Tzu Shiou Yang, Taipei (TW); Chun Chi Lin, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 199 days.

(21) Appl. No.: 17/812,442

(22) Filed: Jul. 13, 2022

(65) Prior Publication Data
US 2023/0397362 A1    Dec. 7, 2023

(30) Foreign Application Priority Data
Jun. 2, 2022    (CN) .......................... 202210624206.6

(51) Int. Cl.
H05K 7/20    (2006.01)

(52) U.S. Cl.
CPC ..... H05K 7/20154 (2013.01); H05K 7/20145 (2013.01); H05K 7/20172 (2013.01)

(58) Field of Classification Search
CPC ...... G06F 1/203; G06F 2200/201; G06F 1/20; H05K 7/20154; H05K 7/20172; H05K 7/20136; H05K 7/20972; H05K 7/20509; H01L 23/467

USPC ..... 361/695, 697, 679.48, 679.46, 690, 692, 361/679.09, 679.55, 701; 165/104.33, 165/80.3

See application file for complete search history.

(56) References Cited

U.S. PATENT DOCUMENTS

| | | |
|---|---|---|
| 9,087,804 B2 | 7/2015 | Wong et al. |
| 10,423,200 B1 | 9/2019 | North et al. |
| 10,969,838 B2 | 4/2021 | He et al. |
| 11,016,529 B1 | 5/2021 | Tucker et al. |
| 11,775,034 B2 | 10/2023 | Chen et al. |
| 11,877,381 B2 | 1/2024 | Cheng et al. |

(Continued)

FOREIGN PATENT DOCUMENTS

| | | | | |
|---|---|---|---|---|
| EP | 1621970 A2 * | 2/2006 | ............ | G06F 1/203 |
| TW | M502876 U | 6/2015 | | |

(Continued)

*Primary Examiner* — Mandeep S Buttar

(74) *Attorney, Agent, or Firm* — CKC & Partners Co., LLC

(57) ABSTRACT

A heat dissipation device includes a housing, a heat dissipation plate, a first fan and at least two second fans. The housing has a first sidewall and a second sidewall that are opposite to each other. The first sidewall has a first opening area. The second sidewall has a second opening area. The first opening area and the second opening area are facing each other. The heat dissipation plate is located inside the housing and covers at least one heat source. An opening penetrates through the heat dissipation plate, and the opening corresponds to the first opening area. The first fan is located inside the opening. The at least two second fans are located nearby the heat dissipation plate. The at least two second fans are facing a first direction. The housing further includes side surfaces that connect the first sidewall and the second sidewall.

10 Claims, 4 Drawing Sheets

(56) References Cited

U.S. PATENT DOCUMENTS

| | | | |
|---|---|---|---|
| 2006/0196639 A1 | 9/2006 | Yang et al. | |
| 2006/0196643 A1* | 9/2006 | Hata | H01L 23/473 |
| | | | 257/E23.098 |
| 2013/0327507 A1* | 12/2013 | Degner | H05K 7/2039 |
| | | | 361/695 |
| 2015/0116928 A1 | 4/2015 | Delano et al. | |
| 2017/0153677 A1* | 6/2017 | Cheng | G06F 1/1637 |
| 2019/0050031 A1* | 2/2019 | Utz | H05K 7/20327 |
| 2020/0128692 A1* | 4/2020 | Singh | G06F 1/203 |
| 2020/0396864 A1 | 12/2020 | Ku et al. | |
| 2021/0149463 A1 | 5/2021 | Lu et al. | |
| 2022/0302757 A1 | 9/2022 | Pei et al. | |
| 2022/0400582 A1* | 12/2022 | Lin | G06F 1/203 |
| 2023/0066801 A1* | 3/2023 | Lin | G06F 1/1656 |
| 2023/0397363 A1 | 12/2023 | Cheng et al. | |
| 2023/0397364 A1 | 12/2023 | Cheng et al. | |
| 2023/0397365 A1* | 12/2023 | Yang | H05K 7/2039 |
| 2023/0422446 A1* | 12/2023 | Hashiba | H05K 7/20336 |

FOREIGN PATENT DOCUMENTS

| | | |
|---|---|---|
| TW | 201925954 A | 7/2019 |
| TW | 202131783 A | 8/2021 |
| TW | M620617 U | 12/2021 |
| TW | I763256 B | 5/2022 |

\* cited by examiner

HEAT DISSIPATION STRUCTURE

CROSS-REFERENCE TO RELATED APPLICATION

This application claims priority to China Application Serial Number 202210624206.6, filed Jun. 2, 2022, which is herein incorporated by reference in its entirety.

BACKGROUND

Field of Invention

The present invention relates to a heat dissipation structure.

Description of Related Art

Air-cooled heat dissipation structures for commercial laptops are typically designed with dual fans. The configuration of the heat dissipation structures are set heat pipes around the heating elements, and through thermal conduction, the heat pipes will transfer the heat to the cooling fans, the heat then will be brought out of the laptop. However, the heating elements (e.g. CPU chips, GPU chips) are often arranged closely because of space limitations. Therefore, heats will build up in certain positions inside the laptop, which is unfavorable for heat dissipation. Moreover, the air entrance of the fan sucks cold air through a single side of the laptop (often from the bottom of the laptop), so that a limited amount of space for drawing cold air will cause poor heat dissipation for the laptops.

SUMMARY

An aspect of the present disclosure is related to a heat dissipation structure.

According to one embodiment of the present disclosure, a heat dissipation structure includes a housing, a heat dissipation plate, a first fan and at least two second fans. The housing has a first sidewall and a second sidewall opposite to each other. A first opening area is located on the first sidewall. A second opening area is located on the second sidewall. The first opening area and the second opening area are opposite to each other. The heat dissipation plate is located inside the housing and covers at least one heat source. The heat dissipation plate has an opening penetrating through the heat dissipation plate. The opening corresponds to the first opening area. The first fan is located inside the opening. The at least two second fans are located near the heat dissipation plate. Each of the airflow exits of the at least two second fans are facing a first direction. The housing further includes side surfaces connecting the first sidewall and the second sidewall. The side surfaces include a side opening area which is facing the first direction.

In an embodiment of the present disclosure, the heat dissipation plate is located nearby the air flow exits of the at least two second fans.

In an embodiment of the present disclosure, the at least one heat source is plural, and the opening separates these heat sources.

In an embodiment of the present disclosure, the side opening area is located nearby the first fan and on a side of the heat dissipation plate.

In an embodiment of the present disclosure, the housing further includes at least one bracket. The at least one bracket is located nearby the side opening area and on the second sidewall. The at least one bracket separates the side opening area and the second opening area.

In an embodiment of the present disclosure, when the at least one bracket is unfolded, a height of a side of the housing is increased.

In an embodiment of the present disclosure, the heat dissipation structure further includes thermal exchangers located between the side opening area and the first fan.

In an embodiment of the present disclosure, the housing includes third opening area and fourth opening area that are located on the first sidewall and the second sidewall respectively. The third opening area and the fourth opening area corresponded to the at least two second fans.

In an embodiment of the present disclosure, the heat dissipation structure further includes first baffles which separate a side of each of the at least two second fans nearby the heat dissipation plate from the heat dissipation plate.

In an embodiment of the present disclosure, the at least two second fans include second baffles which surround airflow entrances of the at least two second fans.

According to the above paragraphs, in the heat dissipation structure of the present disclosure, by setting the airflow entrances of the first fan and two second fans facing the same direction, the heat may be conducted in the same direction, be gathered, and exit outside of the housing. In the other hand, the heat dissipation structure has a heat dissipation plate with a large surface, and heat exchangers, which may increase the efficient heat dissipation area. At the same time, the heat dissipation structure may prevent heat builds up at a certain place, since the heat sources are arranged averagely on the heat dissipation plate. In the other hand, the heat dissipation structure has multiple opening areas on the first sidewall and the second sidewall, which may allow the fans to suck-in cold air in two different directions and improves the amount of cold air for cooling the heat sources. Moreover, the heat dissipation structure has at least one bracket between the airflow exits and the airflow entrances of the fans, which may prevent the hot airflow being brought out of the housing being sucked back into the housing again and thus ensures the heat conduct fluidly and prevents unwanted heat exchanges. Further, the first baffles separate the airflow entrances of the two second fans and the heat dissipation plate. As a result, the heat dissipation structure may limit the convection field of the two second fans, thus preventing unwanted heat exchanges which happens during the heat dissipation.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
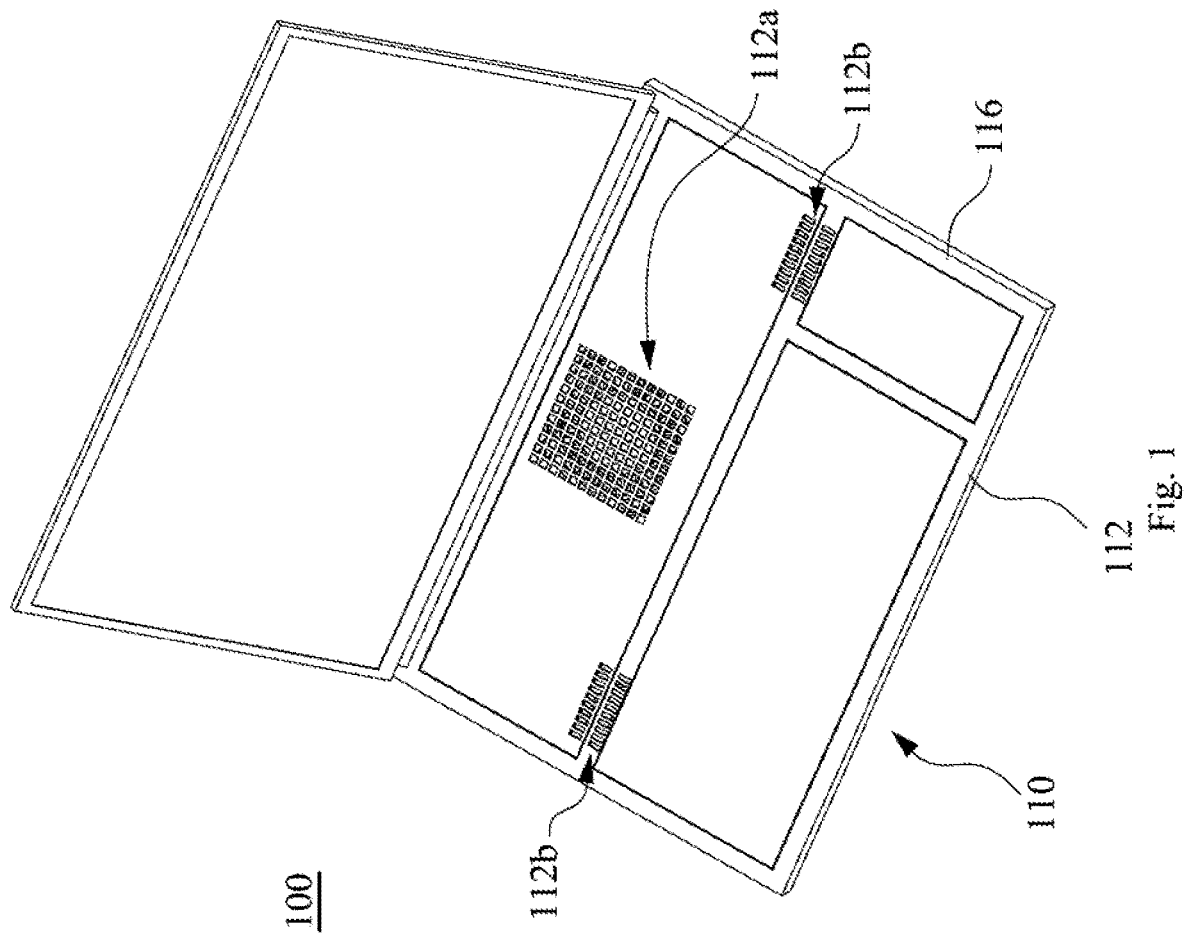
FIG. 1 schematically illustrates a top view of a heat dissipation structure, according to one embodiment of the present disclosure.

Reference will now be made in detail to the present embodiments of the invention, examples of which are illustrated in the accompanying drawings.

Wherever possible, the same reference numbers are used in the drawings and the description to refer to the same or like parts.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
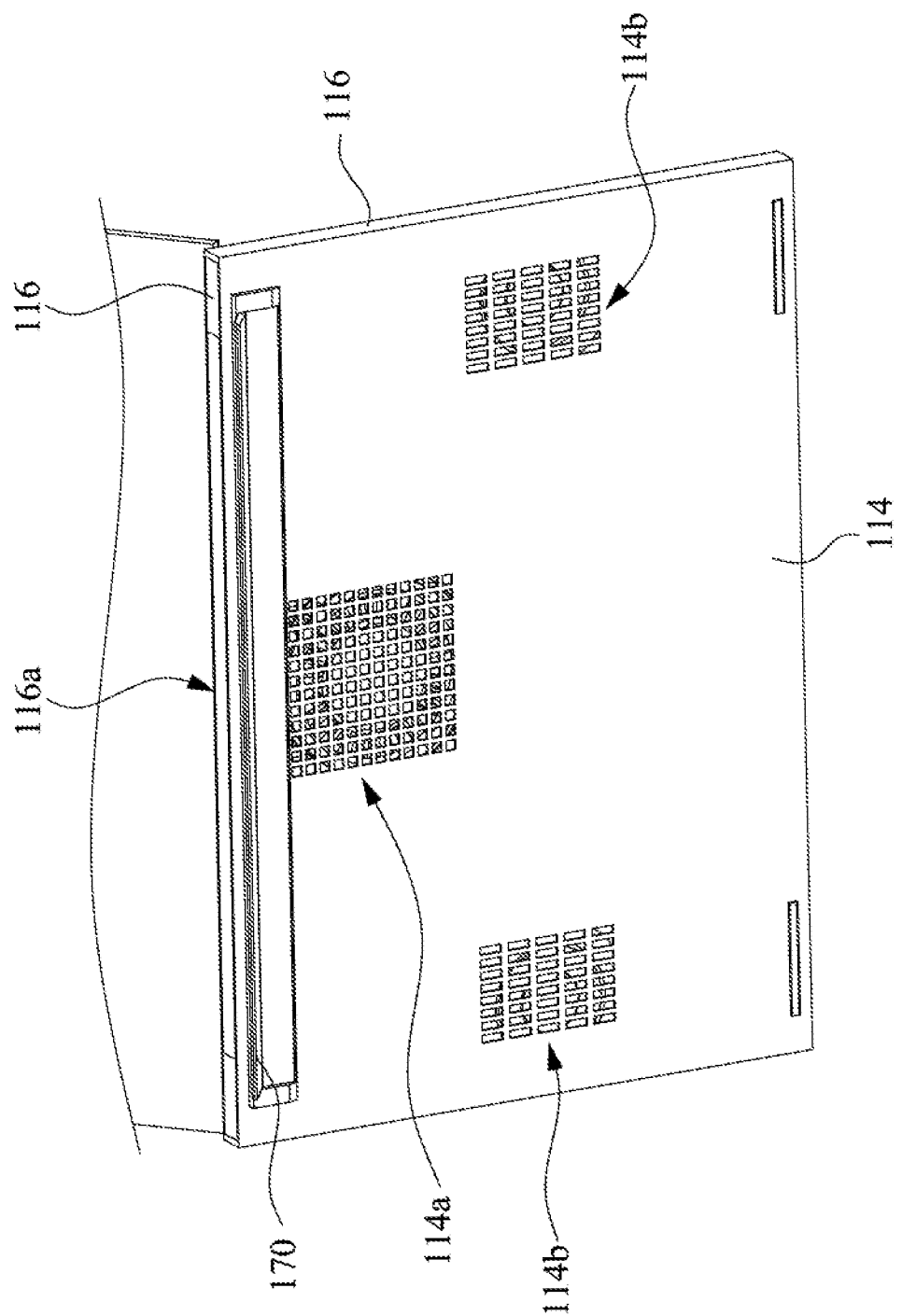
FIG. 2 schematically illustrates a back view of a heat dissipation structure, according to one embodiment of the present disclosure.
Figure 3:
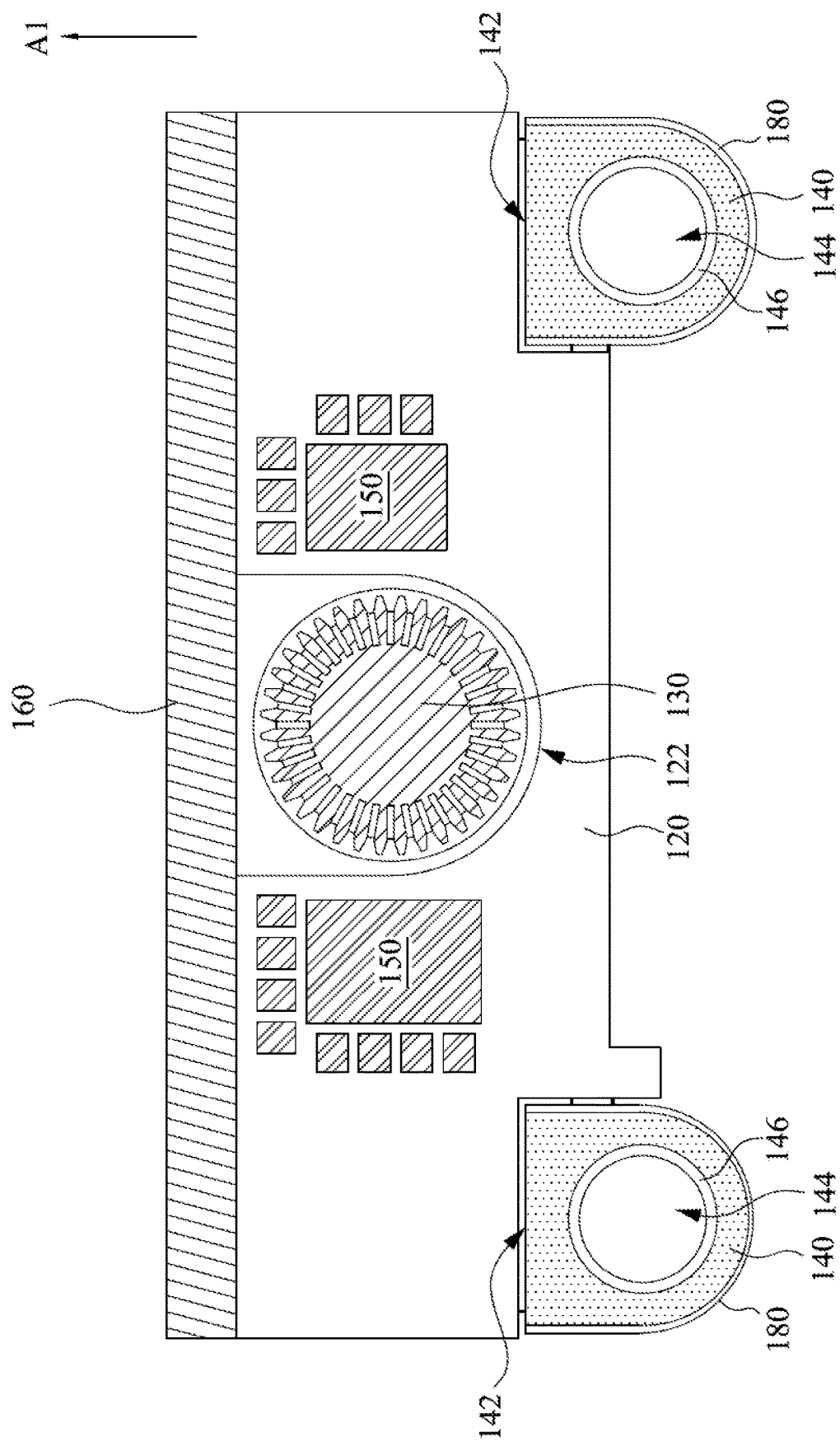
FIG. 3 schematically illustrates a sectional view of a part of a heat dissipation structure inside the housing, according to one embodiment of the present disclosure.

FIG. 1 schematically illustrates a top view of a heat dissipation structure 100, according to one embodiment of the present disclosure. FIG. 2 schematically illustrates a back view of a heat dissipation structure 100, according to one embodiment of the present disclosure. FIG. 3 schematically illustrates a sectional view of a part of a heat dissipation structure 100 inside the housing 110, according to one embodiment of the present disclosure.

References are made to FIG. 1 to FIG. 3, the present disclosure is related to a heat dissipation structure 100 includes a housing 110, a heat dissipation plate 120, a first fan 130 and at least two second fans 140. The housing 110 has a first sidewall 112 and a second sidewall 114 opposite to each other. A first opening area 112a is located on the first sidewall 112. A second opening area 114a is located on the second sidewall 114. The first opening area 112a and the second opening area 114a are opposite to each other. The heat dissipation plate 120 is located inside the housing 110 and covers at least one heat source 150. The heat dissipation plate 120 has an opening 122 penetrate through the heat dissipation plate 120. The opening 122 corresponds to the first opening area 112a. The first fan 130 is located inside the opening 122. The at least two second fans 140 are located near the heat dissipation plate 120. Each of the airflow exits 142 of the at least two second fans 140 are facing a first direction A1. The housing 110 further includes side surfaces 116 connecting the first sidewall 112 and the second sidewall 114. The side surfaces 116 include a side opening area 116a which is facing the first direction A1.

References are made to FIG. 1 to FIG. 2, in some embodiments, the first sidewall 112, second sidewall 114 and the side surfaces 116 of the housing 110 may define an accommodation space to accommodate a part of the heat dissipation structure 100. However, the housing 110 may be a part of other devices, for example, a calculator or a processor. In the other hand, the accommodation space may accommodate other electronic components or devices, such as keyboard, touch pad, stylus, etc., that are not included in the heat dissipation structure. For example, in the embodiment shown in FIG. 1 and FIG. 2, the housing 110 is combined with a laptop, except from the heat dissipation structure 100, the housing 110 also accommodates devices or components, such as, processors, circuit boards, input devices and I/O interfaces.

Figure 4:
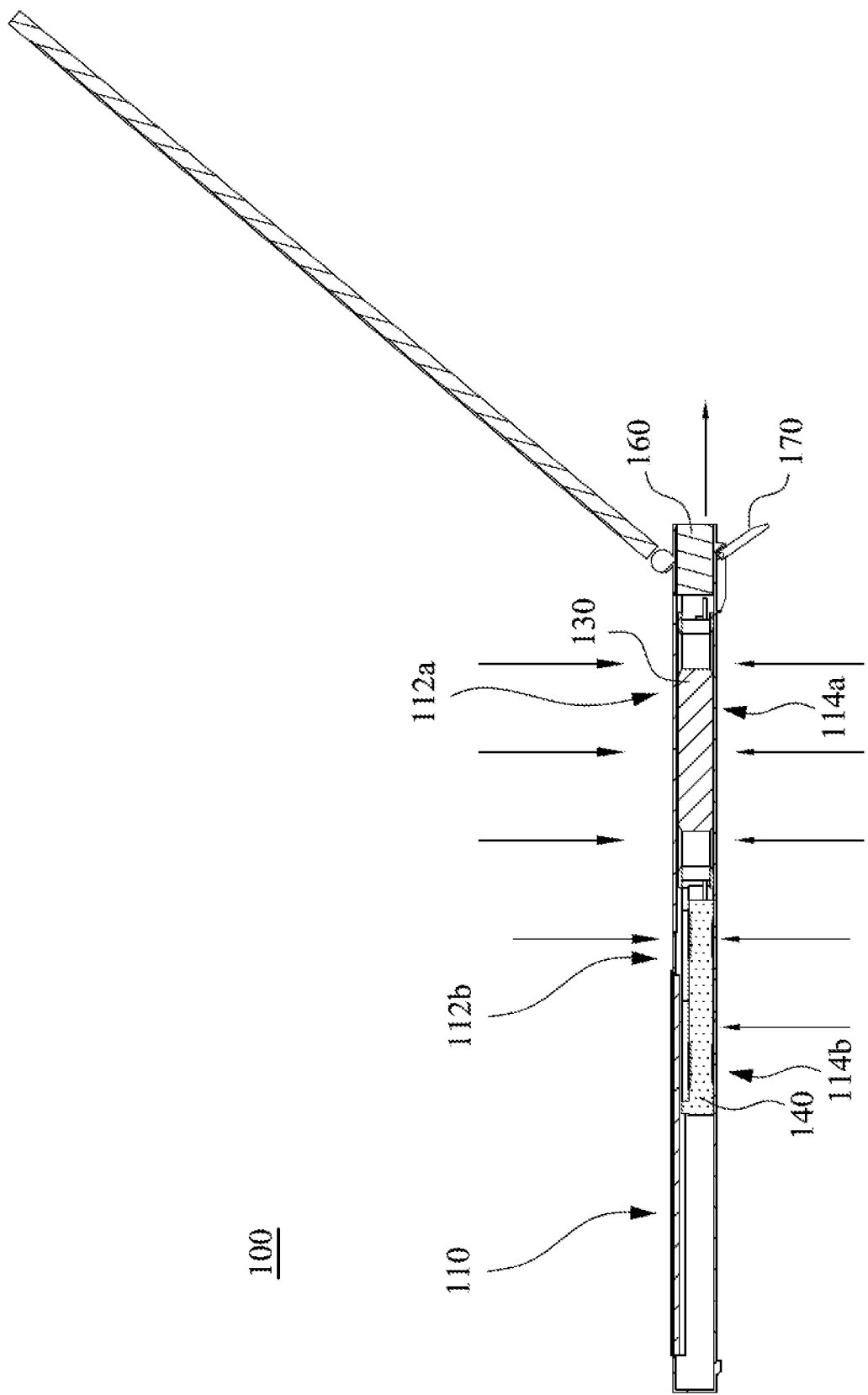
FIG. 4 schematically illustrates a sectional view of a heat dissipation structure, according to one embodiment of the present disclosure.

FIG. 4 schematically illustrates a sectional view of a heat dissipation structure 100, according to one embodiment of the present disclosure.

References are made to FIG. 1 to FIG. 4, the first sidewall 112 and the second sidewall 114 are opposite to each other and the first opening area 112a and second opening area 114a are located on the first sidewall 112 and the second sidewall 114 respectively. In some embodiments, the first opening area 112a and second opening area 114a may include any numbers of openings. When the first opening area 112a and second opening area 114a are opposite to each other, each of the openings of the first opening area 112a and second opening area 114a do not have to correspond to each other. When the first opening area 112a and second opening area 114a are opposite to each other, airflow may flow inside the housing 110 through the first opening area 112a and flow outside of the housing 110 through the second opening area 114a, similarly, the airflow may flow along the opposite direction.

References are made to FIG. 1 to FIG. 4, in some embodiments, the housing 110 includes third opening area 112b and fourth opening area 114b that are located on the first sidewall 112 and the second sidewall 114 respectively. The third opening area 112b and the fourth opening area 114b corresponded to the at least two second fans 140. In some embodiments, The third opening area 112b and the fourth opening area 114b may located nearby the airflow entrances 144 of the at least two second fans 140, and thus to assist the at least two second fans suck in the cold air outside the housing 110. For example, the third opening area 112b may be located on the first sidewall 112 and corresponds to the at least two second fans 140. The fourth opening area 114b may be located on the second sidewall 114 and corresponds to the at least two second fans 140. In some embodiments, the third opening area 112b and the fourth opening area 114b may include any numbers of openings.

References are made to FIG. 1 to FIG. 4, in some embodiments, the side surfaces 116 connect to the first sidewall 112 and the second sidewall 114. The side opening area 116a that are located on the side surfaces 116 is facing the first direction A1. Specifically, the side opening area 116a is located nearby the first fan 130 and the side opening area 116a is located on a side of the heat dissipation plate. As a result, the first fan 130 may assist heat conduction on the heat dissipation plate, at the same time, the airflow may bring the heat outside the housing 110 through the side opening area 116a. In some embodiments, the heat dissipation structure 100 further includes heat exchangers 160 located between the side opening area 116a and the first fan 130. In some embodiments, the heat exchanger 160 may be cooling fins.

Specifically, the heat exchanger 160 may increase the cooling surface area of the heat dissipation plate 120. By installing the heat exchangers 160 at the airflow exits may improve the efficiency of the airflow which may bring the heat out of the housing 110.

In some embodiments, the opening 122 of the heat dissipation plate 120 may be located at the center of the heat dissipation plate 120. Further, in some embodiments, the at least one heat source 150 is plural, and the opening 122 separates these heat sources 150. As a result, the first fan 130 located at the center of the heat dissipation plate 120, the first fan 130 may increase the speed of the heat conduction, also, it may prevent heat from building-up at a certain position and thus improve the efficiency of heat dissipation. On the other hand, the first fan 130 that is located at the center of the heat dissipation plate 120 also may assist the at least two second fans 140 to bring out the hot airflow out of the housing 110, along the first direction A1.

In some embodiments, the heat dissipation plate 120 is located nearby the airflow exits 142 of the at least two second fans 140. Specifically, reference is made to FIG. 3, the airflow exits 142 of the at least two second fans 140 are against two sides of the heat dissipation plate 120. As a result, the cold airflow provided by the airflow exits 142 may cooldown the heat dissipation plate directly, and bring out the hot airflow out of the housing 110 along the first direction A1 at the same time.

The heat dissipation structure 100 may face the airflow exits of the first fan 130 and the airflow exits 142 of the at least two second fans 140 to the first direction A1. As a result, a convection field may be formed inside the housing 110. Moreover, references are made to FIG. 1 to FIG. 3, the first fan 130 and the at least two second fans 140 are located nearby the heat dissipation plate 120, which makes the cold airflow covers the heat dissipation plate 120 in its maximization thus helping dissipation of the heat dissipation plate 120 and improving the dissipation efficiency of the heat dissipation structure 100. Specifically, the arrangement of the first fan 130 and the at least two second fans 140 discussed above also reduce the conduction path of the hot airflow inside the heat dissipation structure 100 at the same time. In other words, the hot airflow will not stay between the convection field of each fans, since the airflow exit of the first fan 130 and the airflow exit 142 of the at least two second fans 140 are facing the first direction A1. Thus, the hot airflow may be brought out of the housing 110 in its shortest path.

References are made to FIG. 1 to FIG. 4, in some embodiments, the housing 110 further includes at least one bracket 170. The at least one bracket 170 is located nearby the side opening area 116a and on the second sidewall 114. The at least one bracket 170 separates the side opening area 116a and the second opening area 114a. Specifically, the at least one bracket 170 may form a convex wall on the second sidewall 114, and separates the cold airflow which will be sucked by the second opening area 114a and the hot airflow which exits from the side opening area 116a. As a result, it may prevent the hot airflow that is brought out by the first fan 130 being sucked back into the housing 110 by the at least two second fans 140. On the other hand, the at least one bracket 170 supports a side of the housing 110, which increases the outer space at the second sidewall 114 of the housing 110. This may improve the fans to get cold airflow more fluidly from the second opening area 114a and the fourth opening area 114b, and improve dissipation efficiency.

In some embodiments, the heat dissipation structure 100 further includes first baffles 180 which separate a side of each of the at least two second fans 140 nearby the heat dissipation plate 120 from the heat dissipation plate 120. For example, reference is made to FIG. 3, a side of each of the at least two second fans 140 are connected to an edge of the heat dissipation plate 120, and the first baffles 180 is located on the side of each of the at least two second fans 140. As a result, it may prevent the airflow entrances 144 of the at least two second fans 140 suck part of the hot airflow while sucking the cold airflow into the housing 110. The first baffles 180 further limited the convection field of the at least two second fans 140 to prevent the unwanted heat exchange that happens between the convection field of the at least two second fans 140 and the first fan 130.

References are made to FIG. 1 to FIG. 3, in some embodiments, the at least two second fans 140 include second baffles 146 which surround airflow entrances 144 of the at least two second fans 140. The second baffles 146 surround the airflow entrances 144 of the at least two second fans 140 may prevent the cold airflow sucked by the at least two second fans 140 comes from the outside of the housing 110. As a result, the airflow entrances 144 may only receive the cold airflow from outside and will not form unwanted heat exchange with the hot airflow inside the housing 110.

The above discussion of some embodiments of the present disclosure, one may clearly see that, in the heat dissipation structure of the present disclosure, by setting the airflow entrances of the first fan and two second fans facing the same direction, the heat may be conducted in the same direction, be gathered, and exit outside of the housing. On the other hand, the heat dissipation structure has a heat dissipation plate with a large surface, and heat exchangers, which may increase the efficient heat dissipation area. At the same time, the heat dissipation structure may prevent heat builds up at a certain place, since the heat sources are arranged averagely on the heat dissipation plate. On the other hand, the heat dissipation structure has multiple opening areas on the first sidewall and the second sidewall, which may allow the fans to suck-in cold air in two different directions and improves the amount of cold air for cooling the heat sources. Moreover, the heat dissipation structure has at least one bracket between the airflow exits and the airflow entrances of the fans, which may prevent the hot airflow being brought out of the housing being sucked back into the housing again and thus ensures the heat conduct fluidly and prevents unwanted heat exchanges. Further, the first baffles separate the airflow entrances of the two second fans and the heat dissipation plate. As a result, the heat dissipation structure may limit the convection field of the two second fans, thus to prevent unwanted heat exchanges that happens during the heat dissipation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A heat dissipation structure, comprising:
    a housing having a first sidewall and a second sidewall opposite to each other, a first opening area is disposed on the first sidewall, a second opening area is disposed on the second sidewall, and the first opening area and the second opening area are opposite to each other;
    a heat dissipation plate disposed inside the housing and covers at least one heat source, and the heat dissipation plate has an opening penetrate through the heat dissipation plate, the opening corresponds to the first opening area;
    a first fan disposed inside the opening; and
    at least two second fans disposed near the heat dissipation plate, and each of the airflow exits of the at least two second fans are facing a first direction,
    wherein the housing further comprises a plurality of side surfaces connecting the first sidewall and the second sidewall, and the side surfaces comprise a side opening area which is facing the first direction.

2. The heat dissipation structure of claim 1, wherein the heat dissipation plate is disposed nearby the airflow exits of the at least two second fans.

3. The heat dissipation structure of claim 1, wherein the at least one heat source is plural, and the opening separates these heat sources.

4. The heat dissipation structure of claim 1, wherein the side opening area is disposed nearby the first fan and on a side of the heat dissipation plate.

5. The heat dissipation structure of claim 4, wherein the housing further comprising at least one bracket, the at least one bracket is disposed nearby the side opening area and on the second sidewall, the at least one bracket separates the side opening area and the second opening area.

6. The heat dissipation structure of claim 5, wherein when the at least one bracket is unfolded, a height of a side of the housing is increased.

7. The heat dissipation structure of claim 4, further comprises a plurality of thermal exchangers disposed between the side opening area and the first fan.

8. The heat dissipation structure of claim 1, wherein the housing comprises a plurality of third opening area and a plurality of fourth opening area that are disposed on the first sidewall and the second sidewall respectively, the third opening area and the fourth opening area corresponded to the at least two second fans.

9. The heat dissipation structure of claim 1, further comprising a plurality of first baffles which separate a side of each of the at least two second fans nearby the heat dissipation plate from the heat dissipation plate.

10. The heat dissipation structure of claim 1, wherein the at least two second fans comprise a plurality of second baffles which surround a plurality of airflow entrances of the at least two second fans.

* * * * *